(12) United States Patent
Thachile et al.

(10) Patent No.: US 8,878,713 B1
(45) Date of Patent: Nov. 4, 2014

(54) CROSSBAR SWITCH CALIBRATION SYSTEM FOR FACILITATING ANALOG-TO-DIGITAL CONVERSION MONOTONICITY

(71) Applicant: Fujitsu Limited, Kanagawa (JP)

(72) Inventors: Pradip Thachile, Los Gatos, CA (US); Magnus O. Wiklund, San Jose, CA (US); William Warren Walker, Los Gatos, CA (US)

(73) Assignee: Fujitsu Limited, Kawasaki-shi (JP)

( * ) Notice: Subject to any disclaimer, the term of this patent is extended or adjusted under 35 U.S.C. 154(b) by 0 days.

(21) Appl. No.: 13/923,293

(22) Filed: Jun. 20, 2013

(51) Int. Cl.
*H03M 1/36* (2006.01)
*H03M 1/34* (2006.01)

(52) U.S. Cl.
CPC ........................................ *H03M 1/34* (2013.01)
USPC ............................ 341/159; 341/155; 341/158

(58) Field of Classification Search
CPC ........... H03M 1/36; H03M 1/00; H03M 1/74; H03M 1/12; H03M 1/42
USPC .................................. 341/120, 155, 158, 159
See application file for complete search history.

(56) References Cited

U.S. PATENT DOCUMENTS

| | | | |
|---|---|---|---|
| 7,075,465 B2* | 7/2006 | Jonsson et al. | 341/120 |
| 2004/0036644 A1* | 2/2004 | Mulder et al. | 341/159 |
| 2004/0169597 A1* | 9/2004 | Mulder et al. | 341/158 |
| 2005/0162195 A1* | 7/2005 | Mulder et al. | 327/74 |

\* cited by examiner

*Primary Examiner* — Jean B Jeanglaude
(74) *Attorney, Agent, or Firm* — Baker Botts L.L.P.

(57) ABSTRACT

A system includes an array of comparators configured to convert an analog input to a digital output, a switch configured to adjust output bits of the digital output, and a control logic; the control logic is configured to initialize the switch and a direct-current source coupled to the analog input; the control logic is configured to increase the direct-current source in incremental steps of a minimal voltage value corresponding to the least significant bit of the digital output; and the control input is also configured to cause the switch to adjust one or more output bits of the digital output based at least in part on a value of the output bit corresponding to the current incremental step.

12 Claims, 10 Drawing Sheets

| S0 | 1 | 0 | 0 | 0 |
|---|---|---|---|---|
| S1 | 0 | 1 | 0 | 0 |
| S2 | 0 | 0 | 1 | 0 |
| S3 | 0 | 0 | 0 | 1 |
|  | U0=S0 | U1=S1 | U2=S2 | U3=S3 |

FIGURE 4C

| S0 | 1 | 0 | 0 | 0 |
|---|---|---|---|---|
| S1 | 0 | 0 | 0 | 0 |
| S2 | 0 | 0 | 1 | 0 |
| S3 | 0 | 0 | 0 | 1 |
|  | U0=S0 | U1==0 | U2=S2 | U3=S3 |

FIGURE 4D

| S0 | 0 | 0 | 1 | 0 |
|---|---|---|---|---|
| S1 | 0 | 1 | 0 | 0 |
| S2 | 1 | 0 | 0 | 0 |
| S3 | 0 | 0 | 0 | 1 |
|  | U0==S2 | U1=S1 | U2==S0 | U3=S3 |

CROSSBAR SWITCH CALIBRATION SYSTEM FOR FACILITATING ANALOG-TO-DIGITAL CONVERSION MONOTONICITY

TECHNICAL FIELD

The present disclosure relates generally to analog-to-digital circuits.

BACKGROUND

An analog-to-digital converter (ADC) converts an analog input into a fixed-width digital output code and form an essential components of many electrical systems. An ideal ADC has a transfer function that converts a unique voltage range into a unique digital code. Non-idealities arising in the fabrication of electronic circuits can create non-idealities in the ADC transfer function, such as non-monotonicity. In an example of non-monotonicity, successive increases in the voltage value may not yield successive increases in the digital code due to random fluctuations in the feature sizes of fabricated circuits.

SUMMARY

Particular embodiments relate to improving monotonicity and linearity in digital output of a non-ideal flash ADC by reordering its comparator array such that reference voltages of the comparators in the array increase monotonically.

The object and advantages of the invention will be realized and attained at least by the elements, features, and combinations particularly pointed out in the claims. It is to be understood that both the foregoing general description and the following detailed description are exemplary and explanatory and are not restrictive of the invention, as claimed.

DESCRIPTION OF EXAMPLE EMBODIMENTS

Figure 1:
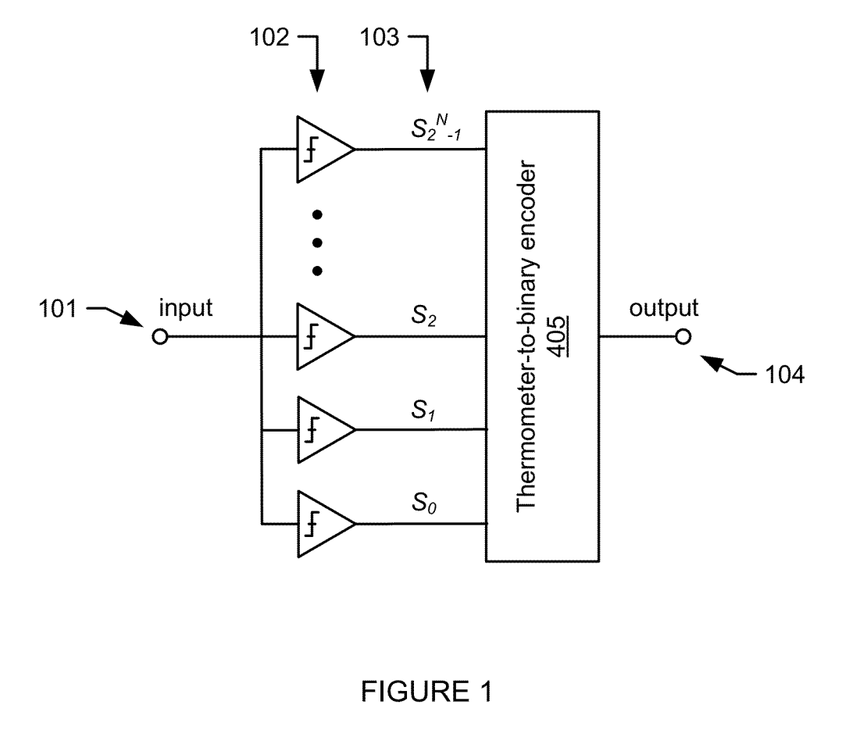
FIG. 1 illustrates an example circuit of a flash ADC.

A flash ADC utilizes an array of comparators, and quantizes an analog input signal by comparing the analog input signal against respective reference voltages of the comparators at a single instant, defined by a clock signal. In an ideal flash ADC, the reference voltages of the comparators are evenly spaced and monotonically increasing. FIG. 1 illustrates an example circuit of a flash ADC. At every change of a clock signal, an array of comparators (102) converts an input voltage (101) into a digital output (103). For a flash ADC of a resolution N, the width of the digital output in the flash ADC is $2^N$ (e.g., $S_0, S_1, S_2, \ldots, S_{2^N-1}$). The digital output (103) is often referred as a thermometer code, as in an ideal flash ADC, data bits $S_0, \ldots, S_j$ corresponding to comparators with reference voltages below the input voltage 101 are all of value "1", while data bits $S_{j+1}, \ldots, S_{2^N-1}$ corresponding to comparators with reference voltages above the input voltage 101 are all of value "0." An encoder 405 converts the thermometer code (e.g., $S_0, S_1, S_2, \ldots, S_{2^N-1}$) to a binary code of length N (104).

Figure 2A:
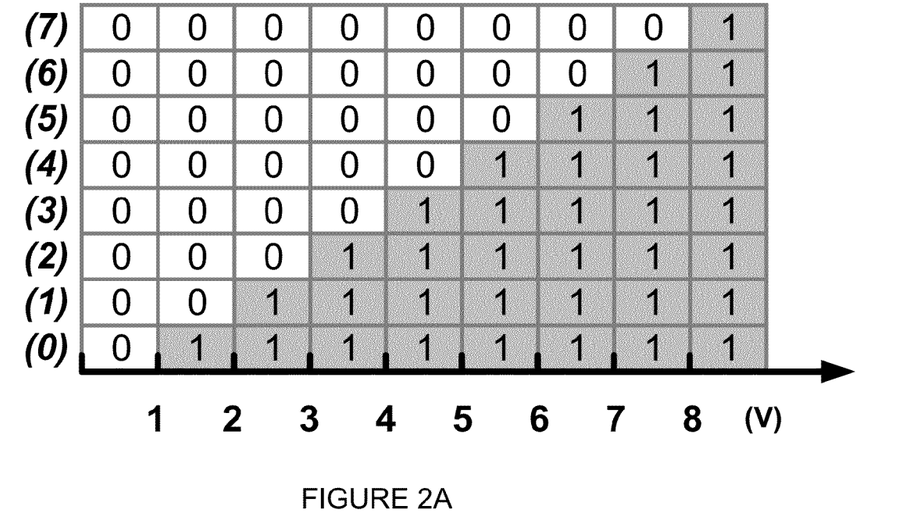
FIGS. 2A-2G illustrate examples of thermometer codes.

FIG. 2A illustrates example thermometer codes for an ideal flash ADC. For didactic purposes, assuming the ideal flash ADC illustrated by FIG. 2A has an array of 8 comparators (denoted from 0, 1, 2, ..., to 7). That is, the ideal flash ADC illustrated by FIG. 2A is an 8-bit wide flash ADC. For didactic purposes, assuming reference voltages for the 8 comparators are 1V, 2V, 3V, ..., and 8V. The 0-th comparator of the comparator array (corresponding to the least significant bit of the 8-bit thermometer code) has a reference voltage of 1V, and the 7-th comparator of the comparator array (corresponding to the most significant bit of the 8-bit thermometer code) has a reference voltage of 8V. In the example of FIG. 2A, an input voltage between 1V and 2V is converted to a thermometer code of 10000000 (in little-endian notation), an input voltage between 2V and 3V is converted to a thermometer code of 11000000, an input voltage between 3V and 4V is converted to a thermometer code of 11100000, etc. An input voltage below 1V (the reference voltage of the 0-th comparator of the comparator array) is converted to a thermometer code of 00000000. An input voltage above 8V (the reference voltage of the 7-th comparator of the comparator array) is converted to a thermometer code of 11111111. As illustrated in FIG. 2A, an idea flash ADC converts a unique voltage range into a unique digital code. Furthermore, the thermometer codes of an ideal flash ADC (having evenly spaced and monotonically increasing reference voltages in its array of comparators) demonstrate monotonic increasing and linear characteristics (as shown by the shaded areas for "1" illustrated in FIG. 2A).

In a non-ideal flash ADC, reference voltages of the comparators in the flash ADC's comparator array may not increase evenly and monotonically. Reference voltages of one or more comparators of the flash ADC may vary from their designed values. For example, reference voltages of one or more comparators of the flash ADC may vary from their designed values due to random fluctuations in the feature sizes of fabricated circuits. FIG. 2B-2F illustrate example thermometer codes for a non-ideal 8-bit wide flash ADC having an array of 8 comparators with designed (ideal) reference voltages of 1V, 2V, 3V, ..., and 8V.

Figure 2B:
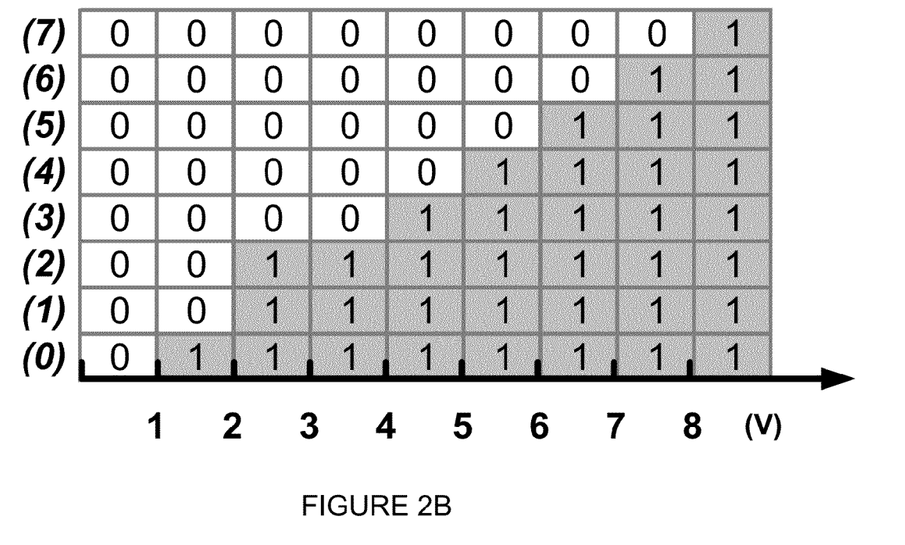
Figure 2C:
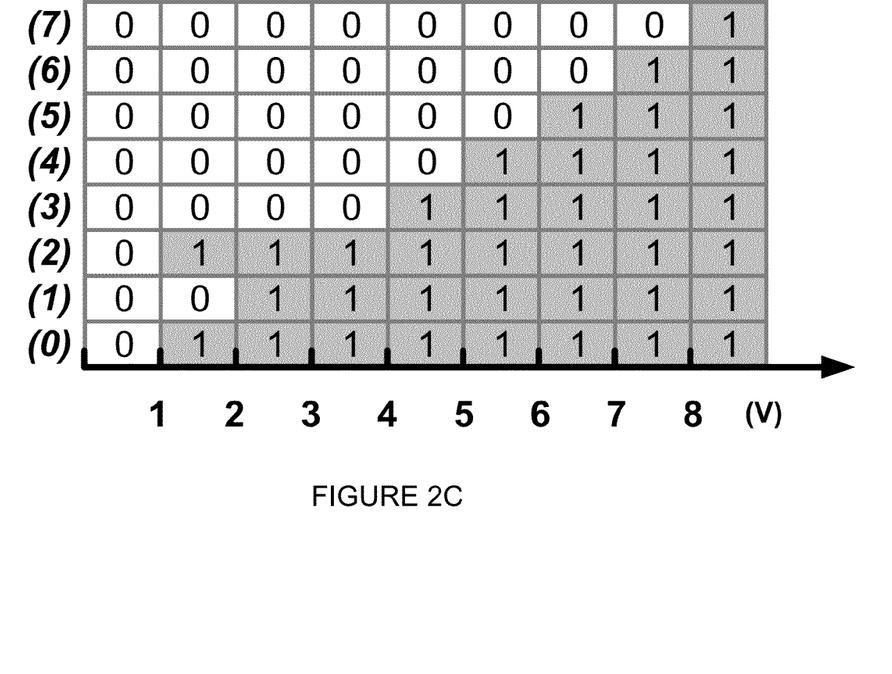

For example, reference voltages of one or more comparators of the non-ideal 8-bit wide flash ADC may be lower than their designed values. For example, reference voltages of the 8 comparators may be 1V, 2V, 2V (instead of 3V as designed), 4V, 5V, 6V, 7V, and 8V. In this case, an input voltage between 2V and 3V is converted to a thermometer code of 11100000, instead of 11000000 as designed, as illustrated in FIG. 2B. In the example of FIG. 2B, the thermometer codes still demonstrate a monotonically increasing characteristic, but with less linearity. For example, reference voltages of the 8 comparators may be 1V, 2V, 1V (instead of 3V as designed), 4V, 5V, 6V, 7V, and 8V. In this case, an input voltage between 2V and 3V is converted to a thermometer code of 11100000, instead of 11000000 as designed, as illustrated in FIG. 2C. Furthermore, an input voltage between 1V and 2V is converted to a code 10100000, which is not a defined thermometer code, and may not be encoded to a binary code correctly without additional processing.

Figure 2D:
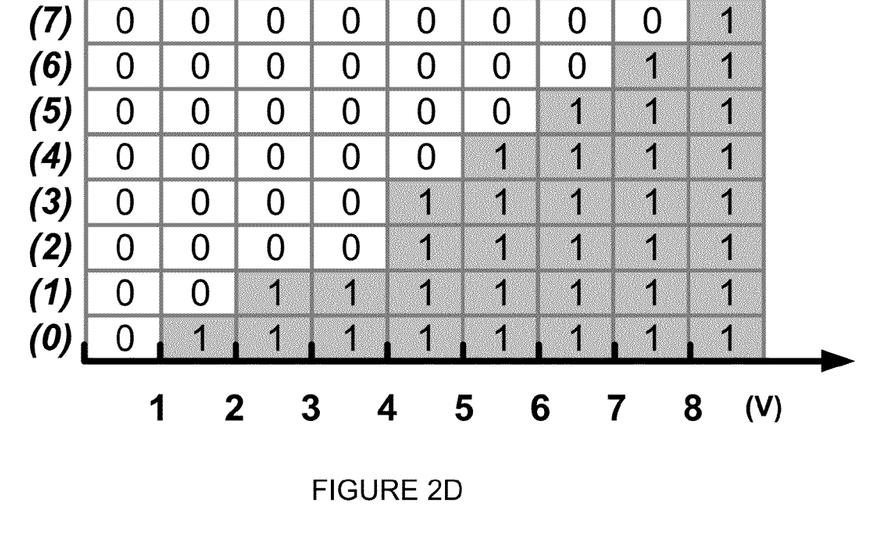
Figure 2E:
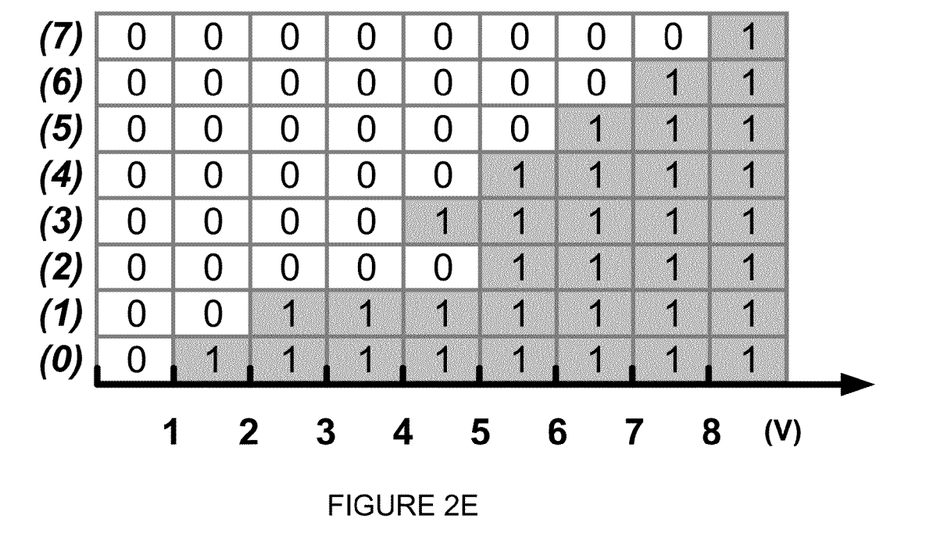

For example, reference voltages of one or more comparators of the non-ideal 8-bit wide flash ADC may be higher than their designed values. For example, reference voltage of the 8 comparators may be 1V, 2V, 4V (instead of 3V as designed), 4V, 5V, 6V, 7V, and 8V. In this case, an input voltage between 3V and 4V is converted to a thermometer code of 11000000, instead of 11100000 as designed, as illustrated in FIG. 2D. In the example of FIG. 2D, the thermometer codes still demonstrate a monotonically increasing characteristic, but with less linearity. For example, reference voltages of the 8 comparators may be 1V, 2V, 5V (instead of 3V as designed), 4V, 5V, 6V, 7V, and 8V. In this case, an input voltage between 3V and 4V is converted to a thermometer code of 11000000, instead of 11100000 as designed, as illustrated in FIG. 2E. Furthermore, an input voltage between 4V and 5V is converted to a code 11010000, which is not a defined thermometer code, and may not be encoded to a binary code correctly without additional processing.

Figure 2F:
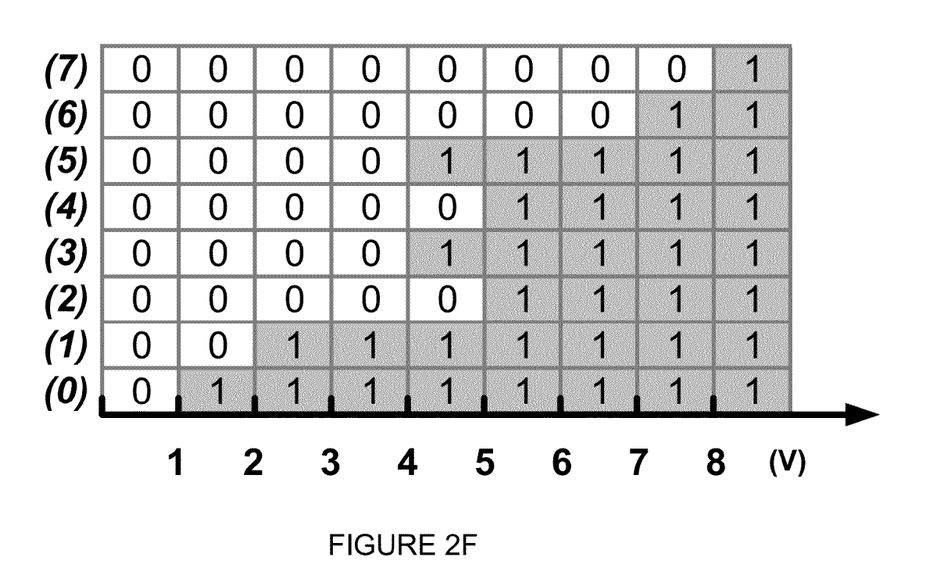

FIG. 2F illustrates yet another example in that reference voltages of one or more comparators of the non-ideal 8-bit wide flash ADC may be different from their designed values. For example, reference voltages of the 8 comparators may be 1V, 2V, 5V (instead of 3V as designed), 4V, 5V, 4V (instead of 6V as designed), 7V, and 8V. In this case, an input voltage between 3V and 4V is converted to a thermometer code of 11000000, instead of 11100000 as designed. An input voltage between 5V and 6V is converted to a thermometer code of 11111100, instead of 11111000 as designed. Furthermore, an input voltage between 4V and 5V is converted to a code 11010100, which is not a defined thermometer code, and may not be encoded to a binary code correctly without additional processing.

Figure 2G:
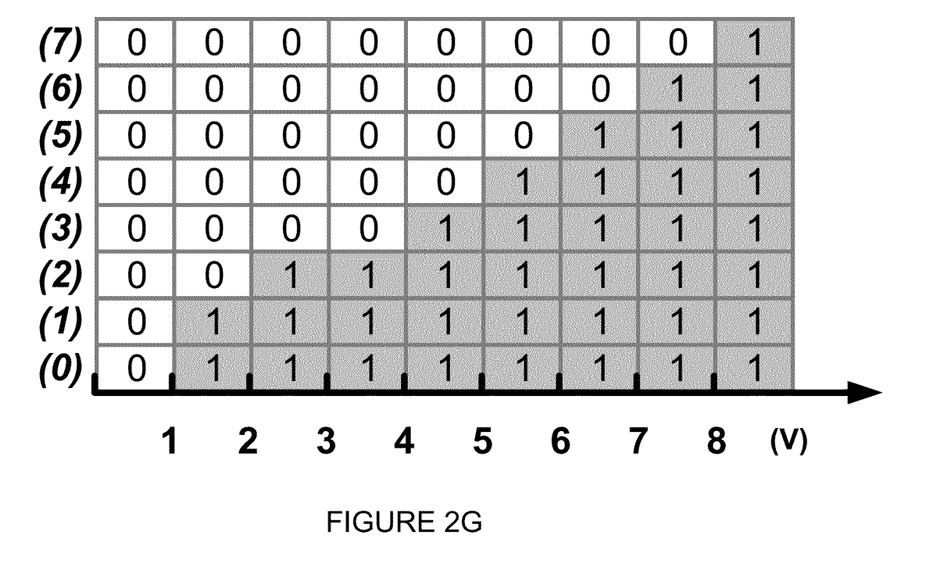

Particular embodiments may improve monotonicity and linearity in digital output of a non-ideal flash ADC by reordering its array of comparators such that reference voltages of the comparators in the array increase monotonically. Using the non-ideal 8-bit wide flash ADC illustrated by FIG. 2C as an example, particular embodiments may swap the comparator at the 1-st position (with the reference voltage of 2V) and the comparator at the 2-nd position (with the reference voltage of 1V) such that reference voltages of the comparators in the comparator array are, from the 0-th position, 1V, 1V, 2V, 4V, 5V, 6V, 7V, and 8V. With the reordered comparator array, an input voltage between 1V and 2V is converted to a thermometer code of 11000000, instead of 10100000 before the reordering, as illustrated in FIG. 2G. Particular embodiments utilize a crossbar switch to reorder bits in the digital output of a flash ADC, which effectively reorders comparators in the flash ADC's comparator array.

Figure 3:
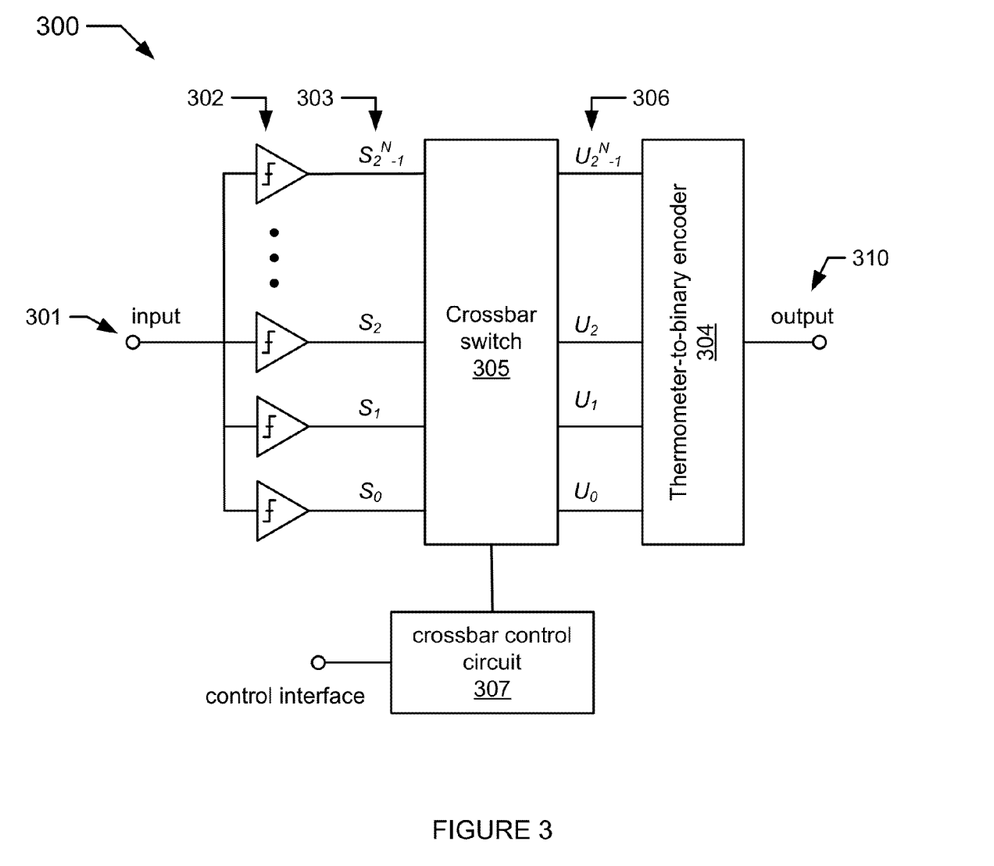
FIG. 3 illustrates an example circuit of a flash ADC incorporating a crossbar switch.

FIG. 3 illustrates an example circuit of a flash ADC 300 incorporating a crossbar switch. In particular embodiments, an array of N comparators 302 may convert an analog input 301 into a digital output, or a thermometer code 303 of width N (e.g., $S_0, S_1, S_2, \ldots, S_{2^N-1}$). The array of N comparators 302 may convert analog input 301 into thermometer code 303 by comparing analog input 301 against respective reference voltages of comparators 302. In particular embodiments, a crossbar switch 305 may modify thermometer code 303 into a modified thermometer code 306 of width N (e.g., $U_0, U_1, U_2, \ldots, U_{2^N-1}$). In particular embodiments, an encoder 304 may convert modified thermometer code 306 to a binary code 310 of length N.

In particular embodiments, crossbar switch 305 may modify thermometer code 303 by mapping thermometer code 303 one-to-one to modified thermometer code 306. That is, modified thermometer code 306 is the same as thermometer code 303 (no reordering). For example, $U_i$ can be equal to $S_i$, for every i=0, 1, 2, . . . , $2^N-1$. In particular embodiments, crossbar switch 306 may modify thermometer code 303 by routing one particular signal in thermometer code 303 to another signal in modified thermometer code 306. That is, $U_i$ can be equal to $S_j$, while i being different from j. In particular embodiments, crossbar switch 306 may modify thermometer code 303 by assigning a value to one or more signals in thermometer code 303. For example, crossbar switch 305 may set $U_i$=0, regardless of values of $S_j$, for every j=0, 1, 2, . . . , $2^N-1$.

FIG. 4 illustrates an example circuit for crossbar switch 305 of FIG. 3. In the example of FIG. 4A, crossbar switch 305 may comprise an array of cells. For example, crossbar switch 305 of a flash ADC of a resolution N can comprise a $2^N$ by $2^N$ array of cells. In particular embodiments, each cell in the array of cells in crossbar switch 305 may store a value. In particular embodiments, the stored value for each cell in the array of cells may be either logic 0 or logic 1. A cell of the array of cells can store a logic value of "0" or "1" using a memory element such as a flip-flop, as illustrated in FIG. 4B. In particular embodiments, a stored cell value of 1 may enable the cell to pass through a particular signal of thermometer code 303. In particular embodiments, a stored cell value of 0 may zero out a particular signal of thermometer code 303 at the output of the cell, regardless the value of the particular signal of the thermometer code 303. As illustrated in FIG. 3, an operator may access control logic 307, causing control logic 307 to program the stored value for each cell in crossbar switch 305. For example, an operator can be a user using a lab test equipment to access control logic 307 to program crossbar switch 305. For example, an automated test equipment (ATE) commonly used in semiconductor manufacturing can access the control logic 307 to program the crossbar switch 305.

Figure 4A:
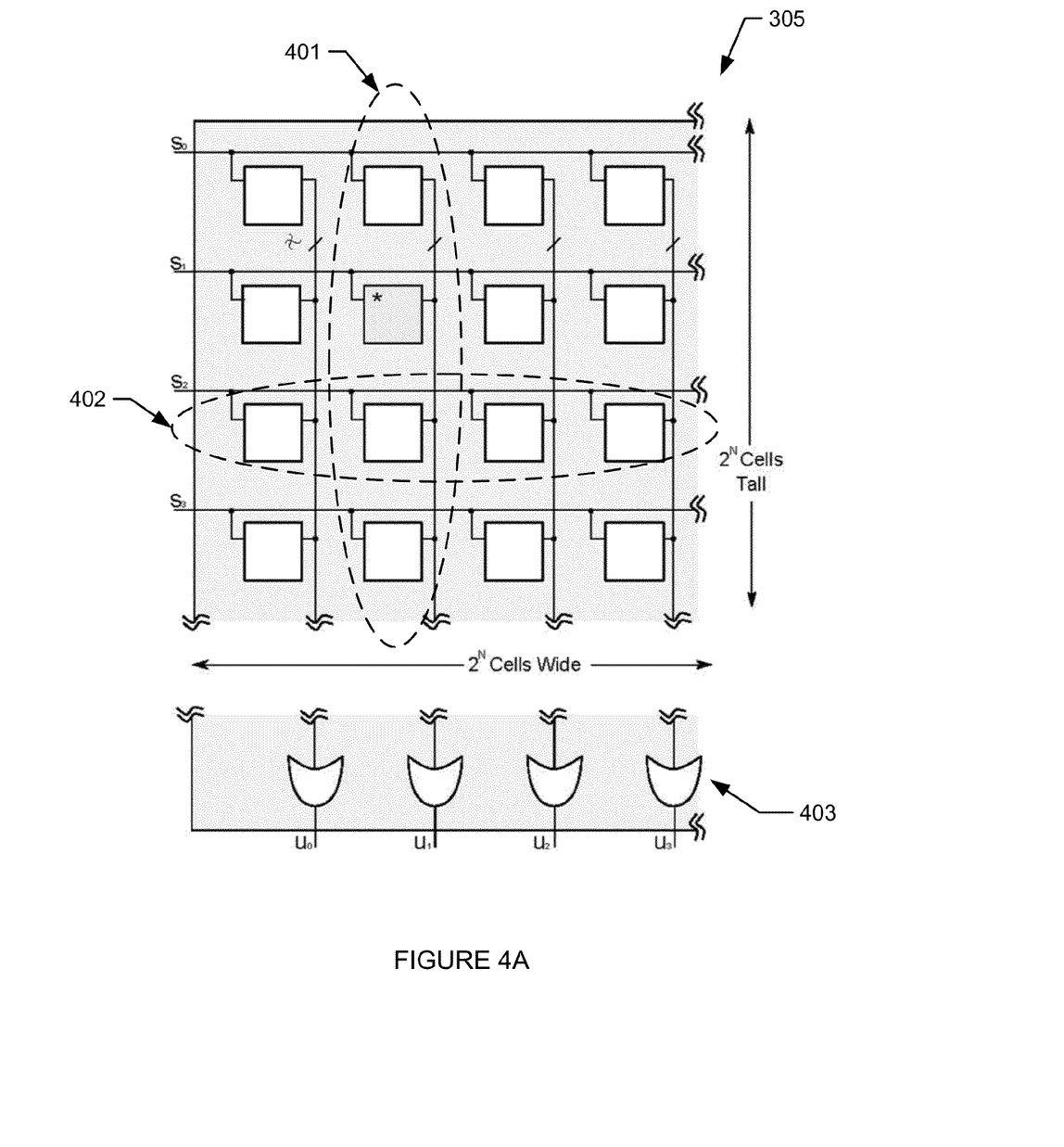
FIG. 4A-4E illustrates an example implementation of a crossbar switch.
Figure 4B:
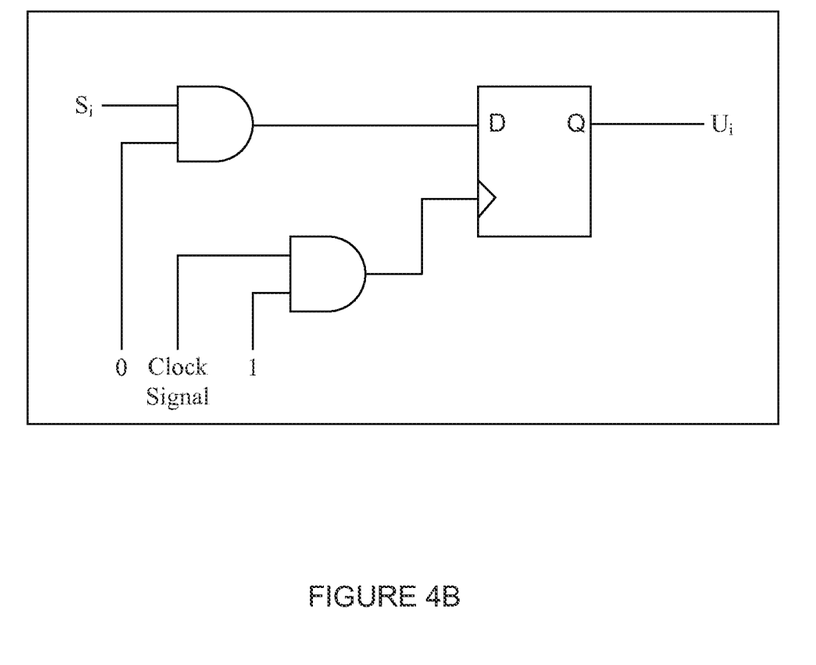
Figure 4C:
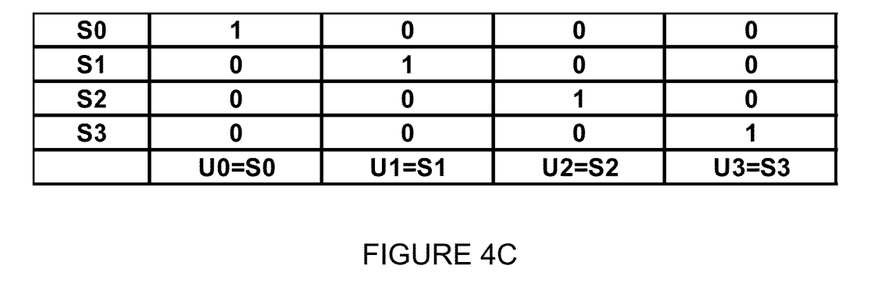
Figure 4D:
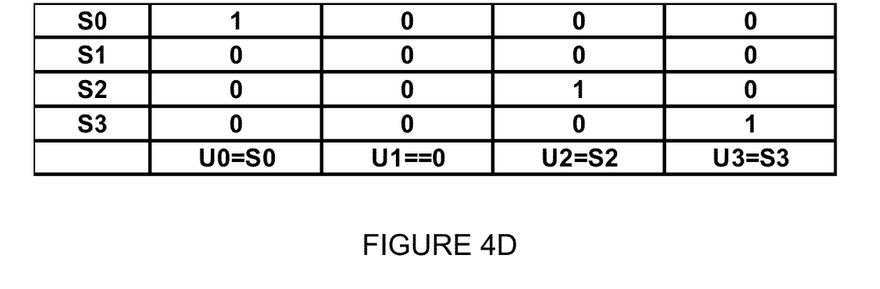
Figure 4E:
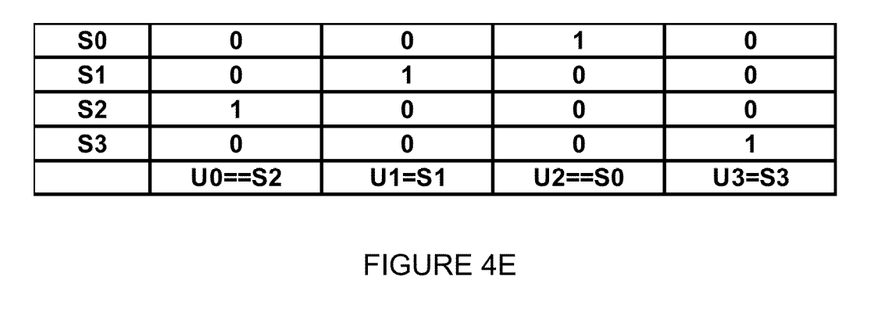

In particular embodiments, the stored values in the cells of the array of cells of crossbar switch 305 may determine how a particular signal in thermometer code 303 is mapped to one or more signals in modified thermometer code 305. In particular embodiments, the stored values in the cells of the array of cells of crossbar switch 305 may set one or more signals in modified thermometer code 306 to be zero, regardless of thermometer code 303 at the time. As in the example of FIG. 4, stored values of each cell in a horizontal row of cells (402) can determine how a particular signal (e.g., $S_2$) of thermometer code 303 can be mapped into modified thermometer code 306. Stored values of each cell in a vertical column of cells (401) can determine a particular signal (e.g., $U_1$) of modified thermometer code 306 by an OR gate (403). FIGS. 4C, 4D, and 4E illustrate mapping examples. FIG. 4C illustrates an example of one-to-one mapping by crossbar switch 305. In the example of FIG. 4C, $U_i$ of modified thermometer code 303 is equal to $S_i$ of the thermometer code, for every i=0, 1, 2, and 3. In this case, the store value of a cell in column j and row k is logic 1 if j is equal to k, and 0 if j is different from k. FIG. 4D illustrates an example of zero-out by a crossbar switch. In the example of FIG. 4D, $U_1$ of modified thermometer code 306 is always logic 0 because all stored values of each cell in column 1 is 0 in crossbar switch 305. FIG. 4E illustrates an example of swapping of signals of modified thermometer code 306 by crossbar switch 305. In the example of FIG. 4E, signal $S_2$ of thermometer code 303 is routed to $U_0$ of modified thermometer code 306. Meanwhile, signal $S_0$ of thermometer code 303 is routed to $U_2$ of modified thermometer code 306. Note that the stored values of row 2, column 0 is logic 1, and row 2, column 0 is logic 0. Meanwhile the stored values of row 0, column 2 is logic 1, and row 2, column 2 is logic 0.

Figure 5:
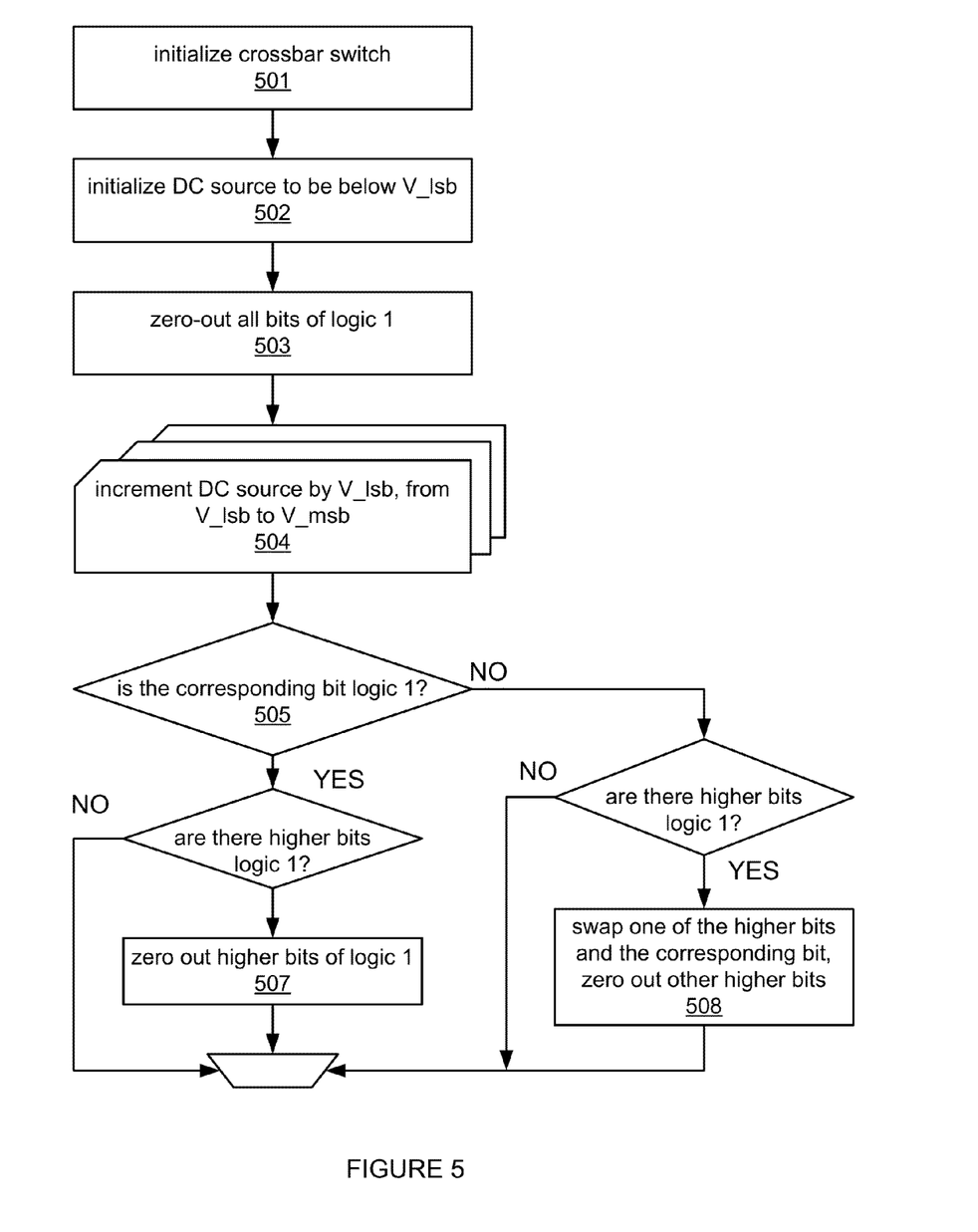
FIG. 5 illustrates an example method for improving monotonicity and linearity of a flash ADC's digital output.

FIG. 5 illustrates an example method for improving monotonicity and linearity of a flash ADC's digital output by reordering bits in the digital output using a crossbar switch. In particular embodiments, control logic 307 may initialize crossbar switch 305 (at 501). In particular embodiments, control logic 307 may initialize crossbar switch 305 by mapping thermometer code 303 one-to-one to modified thermometer code 306. For example, control logic 307 may map thermometer code 303 one-to-one to modified thermometer code 306 by setting diagonal cell values of crossbar switch 305 to logic 1 in crossbar switch 305. FIG. 4C illustrates an example of setting diagonal cell values to logic 1 in crossbar switch 305 to map thermometer code 303 one-to-one to modified thermometer code 306.

In particular embodiments, control logic 307 may access a direct current (DC) source coupled to analog input 301. Control logic 307 may cause the DC source to supply analog input 301 an input voltage with a value less than a minimal voltage value corresponding to the least significant bit of thermometer code 303 (at 502). Using the 8-bit wide flash ADC illustrated by FIG. 2A as an example, the minimal voltage for the least significant bit is 1V. For an ideal flash ADC, all bits in thermometer code 303 (and thus modified thermometer code 306) are logic 0 (e.g., 00000000 as illustrated in FIG. 2A) if a DC source less than a minimal voltage value corresponding to the least significant bit is applied to analog input 301. However, one or more bits in thermometer code 303 (and in modified thermometer code 306) may be of logic 1 in an non-ideal flash ADC. For example, one or more comparators 302 may have reference voltages less than the DC voltage applied to analog input 301. In particular embodiments, control logic 307 may zero-out the one or more bits that are of logic 1 in modified thermometer code 306. For example, control logic 307 may zero-out the one or more bits in modified thermometer code 306 that are of logic 1 by setting one or more cell values in crossbar switch 305 to be logic 0. FIG. 4D illustrates an example of setting a cell value in crossbar switch 305 to logic 0 to zero-out a bit in modified thermometer code 306.

In particular embodiments, control logic 307 may step through the DC source from a minimal voltage value corresponding to the least significant bit of thermometer code 303 to a minimal voltage value corresponding to the most significant bit of thermometer code 303, by an incremental step of the minimal voltage value corresponding to the least significant bit of thermometer code 303 (at 504). Using the 8-bit wide flash ADC illustrated by FIG. 2A as an example, the DC source can be incremented from 1V, 2V, . . . , to 8V. This corresponds to stepping through thermometer codes (of an ideal 8-bit wide flash ADC) from 10000000, 11000000, 11100000, . . . , to 11111111.

In particular embodiments, control logic 307 may determine whether the bit corresponding to a current voltage step in modified thermometer code 306 is logic 1 (at 505). For example, a DC voltage value of 3V corresponds to the third bit from the left in the thermometer code of the 8-bit wide flash ADC illustrated by FIG. 2A. In particular embodiments, if the bit corresponding to the current voltage step is logic 1 and there is no logic 1 in bits higher than the bit corresponding to the current step in modified thermometer code 306 (e.g., 11100000), then control logic 307 may cause the DC source to proceed to the next DC voltage step. In particular embodiments, if the bit corresponding to the current step is logic 1 and if one or more bits higher than the bit corresponding to the current step are of logic 1 in modified thermometer code 306 (e.g., 11100100), then control logic 307 may zero-out the one or more higher bits that are of logic 1 in modified thermometer code 306 (e.g., 11100000) and cause the DC source to proceed to the next DC voltage step (at 507). For example, control logic 307 may zero-out the one or more higher bits in modified thermometer code 306 that are of logic 1 by setting one or more stored cell values in crossbar switch 305 to logic 0. FIG. 4D illustrates an example of setting a cell value in crossbar switch 305 to logic 0 to zero-out a bit in modified thermometer code 306.

In particular embodiments, if the bit corresponding to the current step is logic 0 and there is no logic 1 in bits higher than the bit corresponding to the current step in modified thermometer code 306 (e.g., 11000000), then control logic 307 may cause the DC source to proceed to the next DC voltage step. In particular embodiments, if the bit corresponding to the current step is logic 0 and if one or more bits higher than the bit corresponding to the current step are of logic 1 in modified thermometer code 306 (e.g., 11000110), then control logic 307 may swap one of the one or more higher bits that are of logic 1 in modified thermometer cod 306 and the bit corresponding to the current step in modified thermometer code 306, zero out the other higher bits that are of logic 1 in modified thermometer code 306 (e.g., 11100000), and cause the DC source to proceed to the next DC voltage step (at 508). For example, control logic 307 may swap one of the one or more higher bits that are of logic 1 in modified thermometer code 306 and the bit corresponding to the current voltage step in modified thermometer code 306 by setting corresponding cell values in crossbar switch 305. FIG. 4E illustrates an example of setting cell values in crossbar switch 305 to swap bits in modified thermometer code 306. By swapping a higher bits that is of logic 1 and the bit (having a logic value of 0) corresponding to the current voltage step, particular embodiments effectively reorder two comparators in array of comparators 302 such that after reordering, the comparator for the higher bit in modified thermometer code 306 has a reference voltage higher than that of the comparator for the lower bit. That is, reference voltages of the comparators in array of comparators 302 may increase monotonically after suitable reordering at one or more voltage steps.

Particular embodiments may repeat the operations of the method of FIG. 5, where appropriate. Moreover, although this disclosure describes and illustrates particular operations of the method of FIG. 5 as occurring in a particular order, this disclosure contemplates any suitable operations of the method of FIG. 5 occurring in any suitable order. Furthermore, although this disclosure describes and illustrates particular components, devices, or systems carrying out particular operations of the method of FIG. 5, this disclosure contemplates any suitable combination of any suitable components, devices, or systems carrying out any suitable operations of the method of FIG. 5.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage medium or media, or any suitable combination of two or more of these, where appropriate. A computer-readable non-transitory storage medium or media may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are to be construed as being without limitation to such specifically recited examples and conditions. Although the embodiment(s) of the present inventions have been described in detail, it should be understood that the various changes, substitutions, and alterations could be made hereto without departing from the spirit and scope of the invention.

The invention claimed is:

1. A system comprising:
   an array of comparators configured to convert an analog input to a digital output of a plurality of output bits by comparing the analog input with respective reference levels of the comparators;
   a switch configured to adjust one or more output bits of the digital output; and
   a control logic configured to:
      initialize the switch;
      initialize a direct-current (DC) source, the DC source being coupled to the analog input, to a value less than a minimal voltage value corresponding to a least significant bit of the digital output;
      cause the switch to zero out all output bits that are of logic 1;
      increase the DC source, from a voltage value corresponding to the least significant bit of the digital output to a voltage value corresponding to a most significant bit of the digital output, in incremental steps of a minimal voltage value corresponding to the least significant bit of the digital output; and
      for at least one incremental step:
         if the output bit corresponding to the current incremental step is of logic 1, and one or more higher bits are of logic 1, then:
            cause the switch to zero out the one or more higher bits that are of logic 1;
         and
         if the output bit corresponding to the current incremental step is of logic 0, and one or more higher bits are of logic 1, then:
            cause the switch to swap one of the one or more higher bits and the output bit corresponding to the current incremental step; and
            cause the switch to zero out the remaining of the one or more higher bits of logic 1.

2. The system of claim 1, wherein the switch comprises an array of cells, wherein each cell stores a logic value of 0 or 1.

3. The system of claim 1, wherein:
   the system has a resolution of N bits; and
   the switch comprises a $2^N$ by $2^N$ array of cells.

4. The system of claim 1, wherein to initialize the switch, the control logic is further configured to:
   cause the switch to establish a one-to-one mapping between its input bits and output bits.

5. A method comprising:
   initializing a switch configured to adjust one or more of a plurality of output bits of a digital output of an array of comparators, the array of comparators being configured to convert an analog input to the digital output by comparing the analog input with respective reference levels of the comparators;
   initializing a direct-current (DC) source, the DC source being coupled to the analog input, to a value less than a minimal voltage value corresponding to a least significant bit of the digital output;
   causing the switch to zero out all output bits that are of logic 1;
   increasing the DC source, from a voltage value corresponding to the least significant bit of the digital output to a voltage value corresponding to a most significant bit of the digital output, in incremental steps of a minimal voltage value corresponding to the least significant bit of the digital output; and
   for at least one incremental step:
      if the output bit corresponding to the current incremental step is of logic 1, and one or more higher bits are of logic 1, then:
         causing the switch to zero out the one or more higher bits that are of logic 1;
      and
      if the output bit corresponding to the current incremental step is of logic 0, and one or more higher bits are of logic 1, then:
         causing the switch to swap one of the one or more higher bits and the output bit corresponding to the current incremental step; and
         causing the switch to zero out the remaining of the one or more higher bits of logic 1.

6. The method of claim 5, wherein the switch comprises an array of cells, wherein each cell stores a logic value of 0 or 1.

7. The method of claim 5, wherein:
   the array of comparators has a resolution of N bits; and
   the switch comprises a $2^N$ by $2^N$ array of cells.

8. The method of claim 5, wherein the initializing the switch further comprises:
   causing the switch to establish a one-to-one mapping between its input bits and output bits.

9. One or more computer-readable non-transitory storage media embodying logic that is operable when executed to:
   initialize a switch configured to adjust one or more of a plurality of output bits of a digital output of an array of comparators, the array of comparators being configured to convert an analog input to the digital output by comparing the analog input with respective reference levels of the comparators;
   initialize a direct-current (DC) source, the DC source being coupled to the analog input, to a value less than a minimal voltage value corresponding to a least significant bit of the digital output;
   cause the switch to zero out all output bits that are of logic 1;
   increase the DC source, from a voltage value corresponding to the least significant bit of the digital output to a voltage value corresponding to a most significant bit of the digital output, in incremental steps of a minimal voltage value corresponding to the least significant bit of the digital output; and for at least one incremental step:
  if the output bit corresponding to the current incremental step is of logic 1, and one or more higher bits are of logic 1, then:
    cause the switch to zero out the one or more higher bits that are of logic 1;
  and
  if the output bit corresponding to the current incremental step is of logic 0, and one or more higher bits are of logic 1, then:
    cause the switch to swap one of the one or more higher bits and the output bit corresponding to the current incremental step; and
    cause the switch to zero out the remaining of the one or more higher bits of logic 1.

10. The media of claim 9, wherein the switch comprises an array of cells, wherein each cell stores a logic value of 0 or 1.

11. The media of claim 9, wherein:
the array of comparators has a resolution of N bits; and
the switch comprises a $2^N$ by $2^N$ array of cells.

12. The media of claim 9, wherein to initialize the switch, the logic is further operable to:
  cause the switch to establish a one-to-one mapping between its input bits and output bits.

* * * * *